(12) United States Patent
Wieting

(10) Patent No.: US 8,053,274 B2
(45) Date of Patent: Nov. 8, 2011

(54) SELF CLEANING LARGE SCALE METHOD AND FURNACE SYSTEM FOR SELENIZATION OF THIN FILM PHOTOVOLTAIC MATERIALS

(75) Inventor: Robert D. Wieting, San Jose, CA (US)

(73) Assignee: Stion Corporation, San Jose, CA (US)

( * ) Notice: Subject to any disclaimer, the term of this patent is extended or adjusted under 35 U.S.C. 154(b) by 108 days.

(21) Appl. No.: 12/568,656

(22) Filed: Sep. 28, 2009

(65) Prior Publication Data
US 2011/0223745 A1    Sep. 15, 2011

Related U.S. Application Data

(60) Provisional application No. 61/101,651, filed on Sep. 30, 2008.

(51) Int. Cl.
*H01L 21/06* (2006.01)
(52) U.S. Cl. ........................... 438/102; 438/905
(58) Field of Classification Search .................. 438/102
See application file for complete search history.

(56) References Cited

U.S. PATENT DOCUMENTS

| | | | |
|---|---|---|---|
| 4,213,781 A * | 7/1980 | Noreika et al. | 420/528 |
| 4,996,108 A | 2/1991 | Divigalpitiya et al. | |
| 5,125,984 A | 6/1992 | Kruehler et al. | |
| 5,261,968 A | 11/1993 | Jordan | |
| 5,501,744 A | 3/1996 | Albright et al. | |
| 5,536,333 A | 7/1996 | Foote et al. | |

(Continued)

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

(Continued)

*Primary Examiner* — N Drew Richards
*Assistant Examiner* — Grant Withers
(74) *Attorney, Agent, or Firm* — Kilpatrick Townsend & Stockton LLP

(57) ABSTRACT

According to an embodiment, the present invention provide a method for fabricating a copper indium diselenide semiconductor film using a self cleaning furnace. The method includes transferring a plurality of substrates into a furnace, the furnace comprising a processing region and at least one end cap region disengageably coupled to the processing region, each of the plurality of substrates provided in a vertical orientation with respect to a direction of gravity, the plurality of substrates being defined by a number N, where N is greater than 5, each of the substrates having a copper and indium composite structure. The method also includes introducing a gaseous species including a hydrogen species and a selenium species and a carrier gas into the furnace and transferring thermal energy into the furnace to increase a temperature from a first temperature to a second temperature, the second temperature ranging from about 350 Degrees Celsius to about 450 Degrees Celsius to at least initiate formation of a copper indium diselenide film from the copper and indium composite structure on each of the substrates. The method further includes decomposing residual selenide species from an inner region of the process region of the furnace. The method further includes depositing elemental selenium species within a vicinity of the end cap region operable at a third temperature. Also, the method includes maintaining the inner region substantially free from elemental selenium species by at least the decomposition of residual selenide species from the inner region of the process region.

17 Claims, 10 Drawing Sheets

U.S. PATENT DOCUMENTS

| | | |
|---|---|---|
| 5,665,175 A | 9/1997 | Safir |
| 6,328,871 B1 | 12/2001 | Ding et al. |
| 2006/0220059 A1 | 10/2006 | Satoh et al. |
| 2007/0089782 A1 | 4/2007 | Scheuten et al. |
| 2007/0151596 A1 | 7/2007 | Nasuno et al. |
| 2007/0169810 A1 | 7/2007 | Van Duern et al. |
| 2008/0041446 A1 | 2/2008 | Wu et al. |
| 2008/0092945 A1 | 4/2008 | Munteanu et al. |
| 2008/0092953 A1 | 4/2008 | Lee |

OTHER PUBLICATIONS

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

* cited by examiner

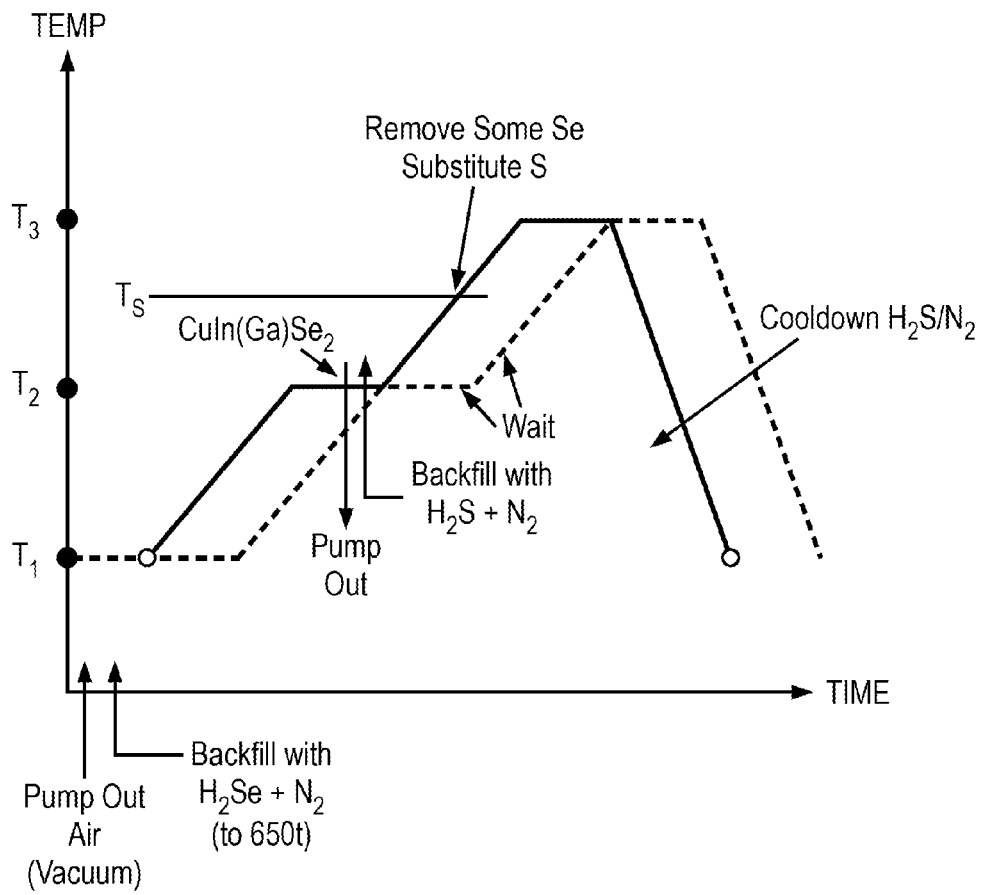
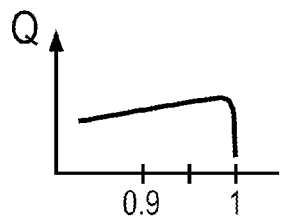
FIG. 5A

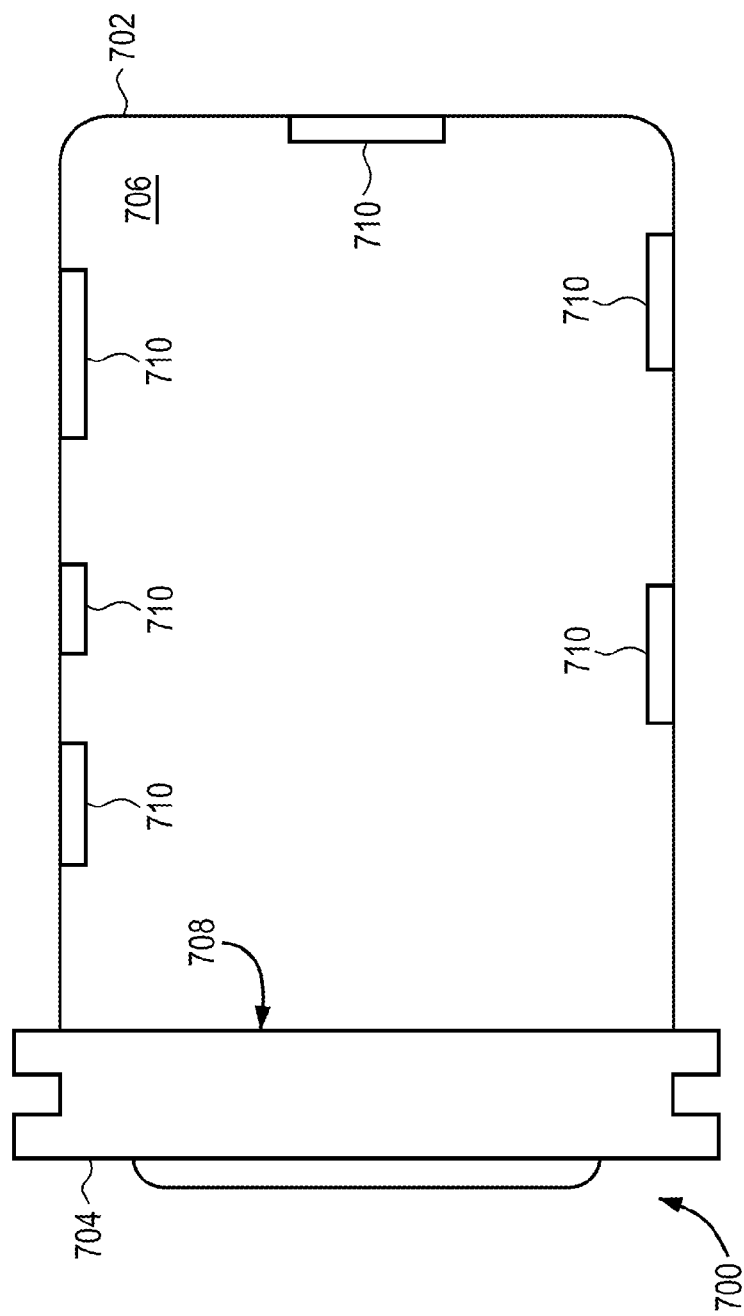

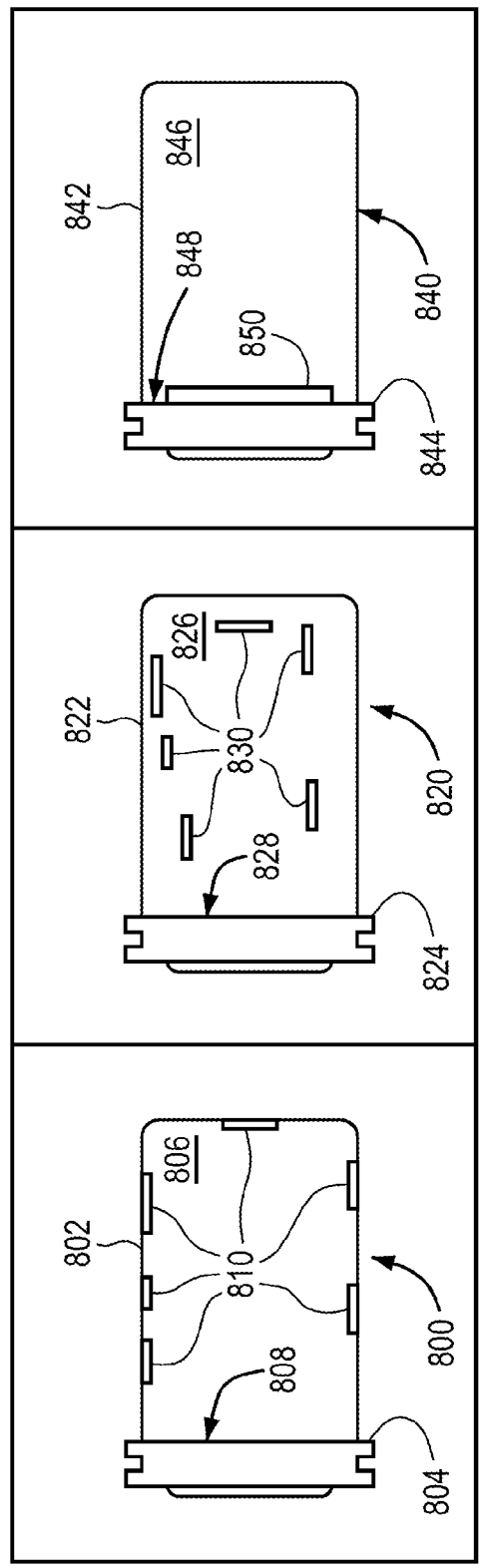

SELF CLEANING LARGE SCALE METHOD AND FURNACE SYSTEM FOR SELENIZATION OF THIN FILM PHOTOVOLTAIC MATERIALS

CROSS-REFERENCES TO RELATED APPLICATIONS

This application claims priority to U.S. Provisional Patent Application No. 61/101,651, filed Sep. 30, 2008, entitled "SELF CLEANING LARGE SCALE METHOD AND FURNACE SYSTEM FOR SELENIZATION OF THIN FILM PHOTOVOLTAIC MATERIALS" by inventor Robert D. Wieting, commonly assigned and incorporated by reference herein for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention relates generally to photovoltaic techniques. More particularly, the present invention provides a method and structure for a thin film photovoltaic device using a copper indium diselenide species (CIS), copper indium gallium diselenide species (CIGS), and/or others. The invention can be applied to photovoltaic modules, flexible sheets, building or window glass, automotive and others.

In the process of manufacturing CIS and/or CIGS types of thin films, there are various manufacturing challenges, such as maintaining structure integrity of substrate materials, ensuring uniformity and granularity of the thin film material, etc. While conventional techniques in the past have addressed some of these issues, they are often inadequate in various situations. Among others, it is often difficult to clean systems (e.g., processing chambers) that is used to manufacture CIS and/or CIGS films. Therefore, it is desirable to have improved systems and method for manufacturing thin film photovoltaic devices.

BRIEF SUMMARY OF THE INVENTION

The present invention relates generally to photovoltaic techniques. More particularly, the present invention provides a method and structure for a thin film photovoltaic device using a copper indium diselenide species (CIS), copper indium gallium diselenide species (CIGS), and/or others. The invention can be applied to photovoltaic modules, flexible sheets, building or window glass, automotive and others.

According to an embodiment, the present invention provide a method for fabricating a copper indium diselenide semiconductor film using a self cleaning furnace. The method includes transferring a plurality of substrates into a furnace, the furnace comprising a processing region and at least one end cap region disengageably coupled to the processing region, each of the plurality of substrates provided in a vertical orientation with respect to a direction of gravity, the plurality of substrates being defined by a number N, where N is greater than 5, each of the substrates having a copper and indium composite structure. The method also includes introducing a gaseous species including a hydrogen species and a selenide species and a carrier gas into the furnace and transferring thermal energy into the furnace to increase a temperature from a first temperature to a second temperature, the second temperature ranging from about 350 Degrees Celsius to about 450 Degrees Celsius to at least initiate formation of a copper indium diselenide film from the copper and indium composite structure on each of the substrates. The method further includes decomposing residual selenide species from an inner region of the process region of the furnace. The method further includes depositing elemental selenide species within a vicinity of the end cap region operable at a third temperature. Also, the method includes maintaining the inner region substantially free from elemental selenide species by at least the decomposition of residual selenide species from the inner region of the process region.

In a specific embodiment, the hydrogen selenide gas is used as work gas in the furnace. As the temperature is around 400° C. or greater, hydrogen selenide gas is thermally activated to be pyrolyzed, forming elemental selenium (Se) or selenium clusters ($Se_2$ or $Se_3$). The end cap region includes a lid with temperature controlled by running active water for cooling and using lamps for heating. The temperature of the lid is monitored to keep cool to serve as a "cyropump" so that the selenium species (elemental selenium and selenium cluster) can deposit over the lid and the reaction between selenium and other film material (such as Indium) is suppressed. After finishing one or more process cycles, the lid of the end cap region can be further cleaned with a cloth, for example linseed cloth, or similar material to remove the deposited selenium residues and particles.

It is to be appreciated that the present invention provides numerous benefits over conventional techniques. Among other things, the systems and processes of the present invention are compatible with conventional systems, which allow cost effective implementation. In various embodiments, residue gases are aggregated into a specific region of processing chamber to allow easy cleaning. There are other benefits as well.

BRIEF DESCRIPTION OF THE DRAWINGS

FIGS. 5 and 5A are simplified diagrams of a temperature profile of the furnace according to an embodiment of the present invention;

FIG. 7 is a simplified diagram of a self cleaning furnace before the decomposition of the selenide species according to an embodiment of the present invention;

FIG. 8A is a simplified diagram of a self cleaning furnace before the decomposition of the selenide species according to an embodiment of the present invention;

FIG. 8B is a simplified diagram of a self cleaning furnace during the decomposition of the selenide species and deposition of elemental selenium at the end cap according to an embodiment of the present invention;

FIG. 8C is a simplified diagram of a self cleaning furnace after the decomposition of the selenide species and deposition of elemental selenium at the end cap according to an embodiment of the present invention.

DETAILED DESCRIPTION OF THE INVENTION

The present invention relates generally to photovoltaic techniques. More particularly, the present invention provides a method and structure for a thin film photovoltaic device using a copper indium diselenide species (CIS), copper indium gallium diselenide species (CIGS), and/or others. The invention can be applied to photovoltaic modules, flexible sheets, building or window glass, automotive, and others.

Figure 1:
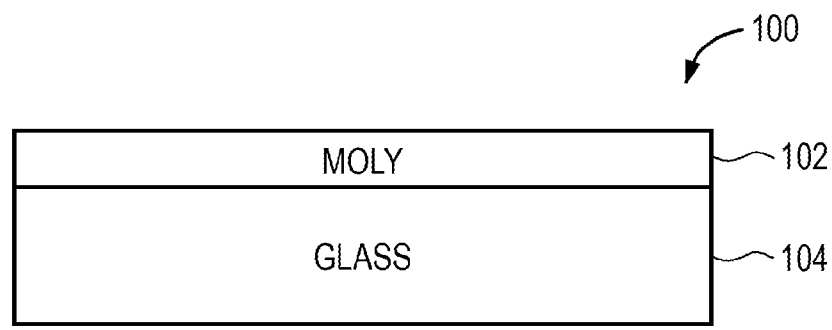
FIG. 1 is a simplified diagram of a transparent substrate with an overlying electrode layer according to an embodiment of the present invention.

FIG. 1 is a simplified diagram of a transparent substrate with an overlying electrode layer according to an embodiment of the present invention. This diagram is merely an example, which should not limit the scope of the claims herein. As shown, structure 100 includes a transparent substrate 104. In an embodiment, substrate 104 can be a glass substrate, for example, a soda lime glass. However, other types of substrates can also be used. Examples of substrates include borosilicate glass, acrylic glass, sugar glass, specialty Corning™ glass, and others. As shown, a contact layer comprising a metal electrode layer 102 is deposited upon substrate 104. According to an embodiment, the metal electrode layer 102 comprises metal material that is characterized by a predetermined conductivity that is optimized for thin-film based solar cell applications. Depending on the application, the metal electrode layer 102 may be deposited in various ways. For example, the metal electrode layer 102 comprises primarily a film of molybdenum that is deposited by sputtering. For example, the thickness may range from 200 to 700 nm. A sputtering apparatus, such as a DC magnetron sputtering apparatus, can be used to deposit a thin film of materials upon a substrate. Such apparatus is well known and commercially available. But it is to be understood that other types of equipments and/or processes, such as evaporation in vacuum based environment may be used as well. As an example, the sputtering deposition process is described below.

Sputter deposition is a physical vapor deposition (PVD) method of depositing thin films by sputtering, or ejecting, material from a "target", or source, which then deposits onto a substrate, such as a silicon wafer or glass. Sputtered atoms ejected from the target have a wide energy distribution, typically up to 10's of eV's (100000 K). The entire range from high-energy ballistic impact to low-energy thermalized motion is accessible by changing the background gas pressure. The sputtering gas is often an inert gas such as argon. For efficient momentum transfer, the atomic weight of the sputtering gas should be close to the atomic weight of the target, so for sputtering light elements neon is preferable, while for heavy elements krypton or xenon are used. Reactive gases can also be used to sputter compounds. The compound can be formed on the target surface, in-flight or on the substrate depending on the process parameters. The availability of many parameters that control sputter deposition make it a complex process, but also allow experts a large degree of control over the growth and microstructure of the film.

Figure 2:
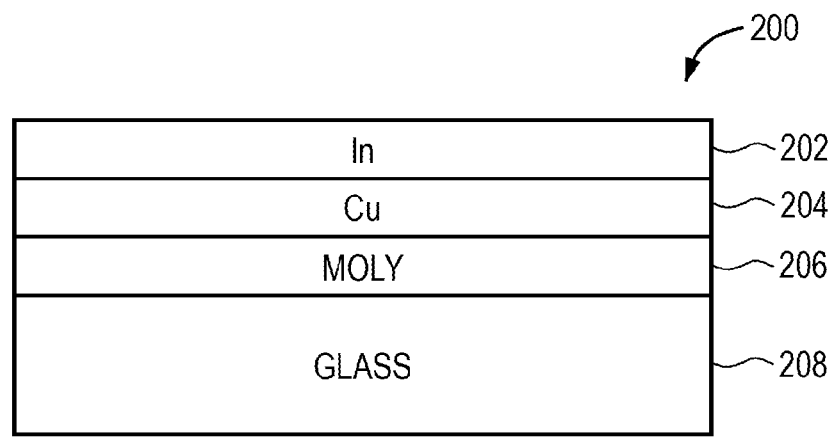
FIG. 2 is a simplified diagram of a composite structure including a copper and indium film according to an embodiment of the present invention.

FIG. 2 is a simplified diagram of a composite structure including copper and indium material according to an embodiment of the present invention. This diagram is merely an example, which should not limit the scope of the claims herein. In this embodiment, structure 200 is includes a glass substrate 208, preferably soda lime glass, which is about 1 to 3 millimeters thick. For example, the glass substrate 208 serves as an supporting layer. The metal layer 206 is deposited upon substrate 208. For example, the metal layer 206 serves as a metal electrode layer to provide electrical contact. For example, the layer 206 comprises primarily a film of molybdenum which has been deposited by sputtering to a thickness of from 200 to 700 nm. In a specific embodiment, an initial film of chromium is first deposited upon glass 208. For example, the chromium layer is provided to insure good adhesion of the overall structure to the substrate 208. Other types of material may also be used in a barrier layer, such as silicon dioxide, silicon nitride, et al. Layers 204 and 202 include primarily a copper layer and an indium layer deposited upon metal layer 206 by a sputtering process. As shown in FIG. 2, the indium layer overlays the copper layer. But it is to be understood that other arrangements are possible. In another embodiment, the copper layer overlays the indium layer. As an example, a sputtering apparatus, such as a DC magnetron sputtering apparatus, is used to deposit the thin film (e.g., layer 202, 204, and/or 206) of materials upon a substrate. It is to be appreciated that various types of sputtering apparatus may be used. Such apparatus is well known and commercially available. Other material can also be used. It is to be appreciated that techniques described throughout the present application are flexible and that other types of equipments and/or processes, such as evaporation in vacuum based environment may be used as well for depositing copper and indium material. In certain embodiments, gallium material (not shown in FIG. 2) may be formed deposited in addition to the copper and indium material. According to an embodiment, the ratio between the copper and indium material is less than 1 (e.g., 0.92-0.96); that is, less than one part of copper per one part of indium material.

Figure 2A:
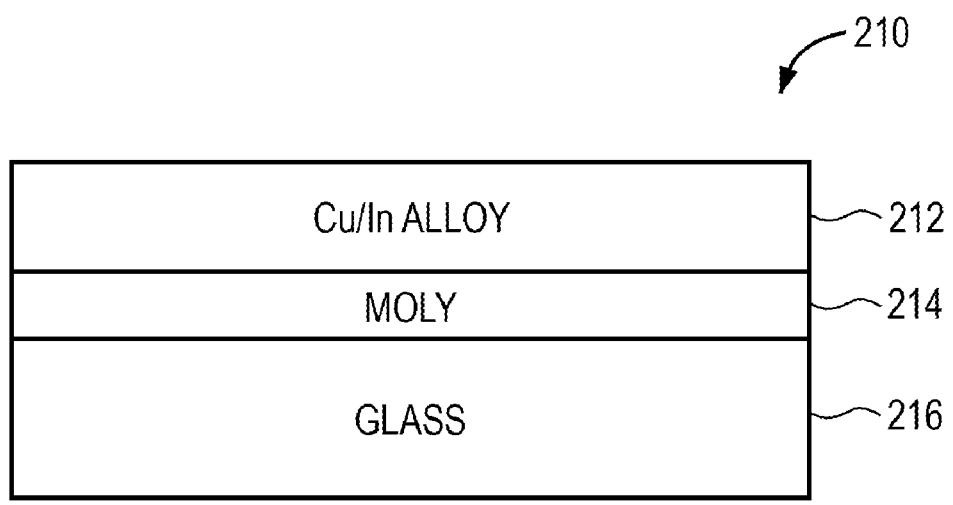
FIG. 2A is a simplified diagram of a composite structure including a copper indium composite/alloy according to an embodiment of the present invention.

As an example, the structure 200 is formed by processing the structure 100. For example, the Cu and In are deposited onto the structure 100 to form the structure 200. As described, sputtering process is used for forming the copper and/or indium layer. In the embodiment illustrated in FIG. 2, the Cu film and the In film are shown as two separate layers. In another embodiment, a Cu/In composite or Cu/In alloy is formed during the sputtering process, as shown in FIG. 2A. It is to be appreciated that techniques described throughout the present application are flexible and that other types of equipments and/or processes, such as evaporation in vacuum based environment may be used as well for depositing copper and indium material. In certain embodiments, gallium material (not shown in FIG. 2) may be formed deposited in addition to the copper and indium material.

FIG. 2A is a simplified diagram of a composite structure 210 including a copper and indium composite film according to another embodiment of the present invention. This diagram is merely an example, which should not limit the scope of the claims herein. As shown, the structure 210 includes a transparent substrate 216. In an embodiment, substrate 216 can be a glass substrate, for example, a soda lime glass. A back contact comprises a metal electrode layer 214 is deposited upon substrate 216. For example, the layer 214 comprises primarily a film of molybdenum material is deposited by sputtering. In a specific embodiment, an initial film of chromium is deposited upon glass 216 before depositing the chromium material to provide for good adhesion of the overall structure to the substrate 210. The layer 212 comprises primarily a copper indium alloy or copper indium composite material. For example, the mixing or alloying of copper indium results in an improved homogeneity or advantageous morphology of the composite copper and indium film. This improved structure is carried over into the desired CIS film after the selenization step. According to an embodiment, an copper indium alloy material is formed from separate layers of copper and indium material, which diffuse into each. For example, the process of forming of copper indium alloy material is facilitate by providing subjecting the structure to a high temperature.

Figure 3:
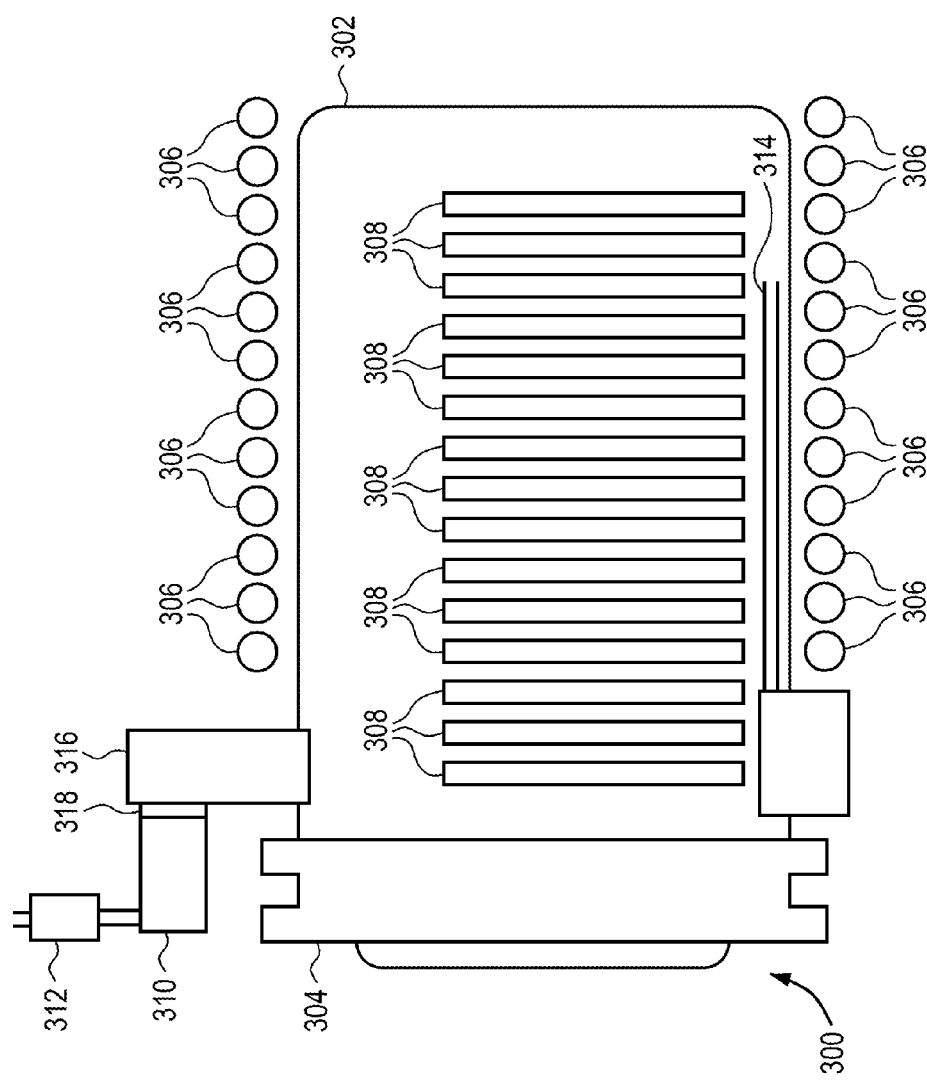
FIG. 3 is a simplified diagram of a furnace according to an embodiment of the present invention.

FIG. 3 is a simplified diagram of a furnace according to an embodiment of the present invention. This diagram is merely an example, which should not limit the scope of the claims herein. As shown, a furnace 300 includes a process chamber 302 and a chamber end cap 304. The inner surface and spatial region of the process chamber 302 is represented as an inner process region 320. In an embodiment, process chamber 302 can comprise a quartz tube. An end cap region 322 represents the inner surface of the end cap 304 and nearby surface of the tube that is partially exposed to the inner process region 320. In an embodiment, end cap 304 can be made of a metal material. In certain embodiments, the end cap 304 and the process chamber 302 are characterized by different surface reactivity, heat conductivity, adhesiveness, and/or other characteristics. For example, under a certain condition various types of materials may deposit on the end cap 304 but not on the inner surface of chamber 302 directly exposed to the samples or substrates to be loaded in the chamber. In a specific embodiment, the end cap region 302 is made of material that has lower specific heat than the process chamber 302. As shown in FIG. 3, the furnace 300 includes a vacuum-pumping machine that comprises a turbomolecular pump 310 and a rotary pump 312. Depending on the application, the vacuum-pumping machine can be implemented by way of a combination of a mechanical booster pump and a dry pump. For example, the raw material gas and/or a diluting gas such as helium, nitrogen, argon, or hydrogen can be introduced in process chamber 302 via a gas injection pipe 314, if demanded by the specific applications and/or processes. The chamber 302 is evacuated by the turbomolecular pump 310 via the rotary pump 312 that is connected with a manifold 316 via a gate valve and a conductance valve 318. For example, there are no special partitions in the manifold or in the reaction furnaces. A heating element 306 is mounted outside the reaction chamber 302.

The furnace 300 can be used for many applications. According to an embodiment, the furnace 300 is used to apply thermal energy to various types of substrates and to introduce various types of gaseous species, among others. In an embodiment, one or more glass plates or substrates are positioned vertically near the center of chamber 302. As an example, substrates 308 can be similar to those described in FIGS. 2 and 2A (e.g., Cu/In layers or composite Cu/In layer overlying a metal contact layer on a substrate). These layers placed in the process chamber in the presence of a gas containing selenium, such as $H_2Se$. After annealing the material for a given period of time, the copper, indium and selenium interdiffuse and react to form a high quality copper indium diselenide (CIS) film.

Figure 4:
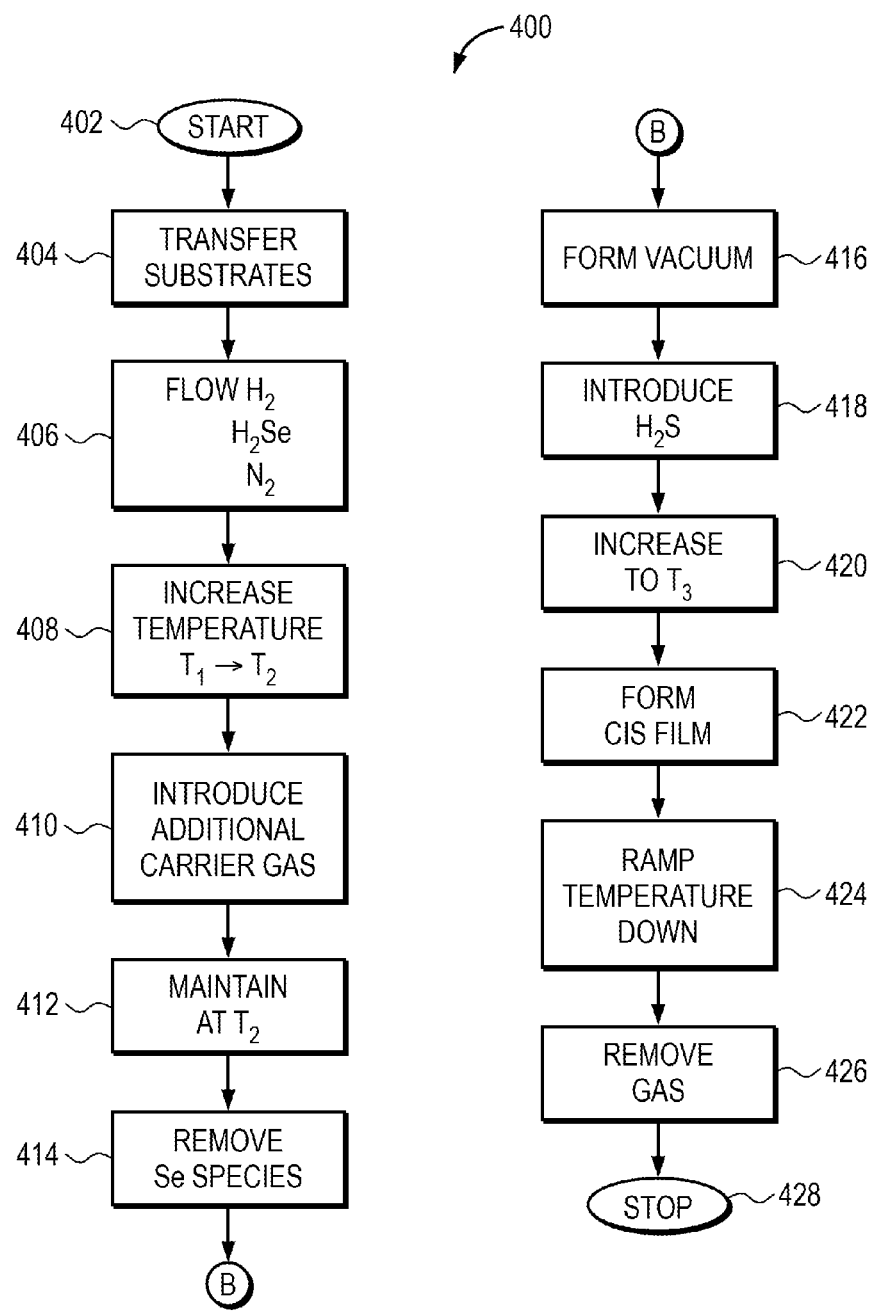
FIG. 4 is a simplified diagram of a process for forming a copper indium diselenide layer according to an embodiment of the present invention.

FIG. 4 is a simplified diagram of a process for forming a copper indium diselenide layer according to an embodiment of the present invention. This diagram is merely an example, which should not limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 4, the present method can be briefly outlined below.

1. Start;
2. Provide a plurality of substrates having a copper and indium composite structure
3. Introduce a gaseous species including a hydrogen species and a selenium species and a carrier gas into the furnace;
4. Transfer thermal energy into the furnace to increase a temperature from a first temperature to a second temperature;
5. Maintain the temperature at about the second temperature for a period of time;
6. Decompose any residual selenide species from an inner region of the process region of the furnace;
7. Decrease the temperature to a third temperature;
8. Maintain the temperature at about the third temperature for a period of time;
9. Deposit elemental selenium species within a vicinity of the end cap region operable at a third temperature;
10. Ramp down the temperature from the third temperature to about the first temperature;
11. Remove gas; and
12. Stop.

These steps are merely examples and should not limit the scope of the claims herein. One of ordinary skill in the art would recognize many other variations, modifications, and alternatives. For example, various steps outlined above may be added, removed, modified, rearranged, repeated, and/or overlapped, as contemplated within the scope of the invention. As shown, the method 400 begins at start, step 402. Here, the user of the method begins at a process chamber, such as the one noted above, as well as others. The process chamber can be maintained at about room temperature before proceeding with the present method.

A plurality of substrates is transferred into the process chamber, step 402. Each of the plurality of substrates can be provided in a vertical orientation with respect to gravity. The plurality of substrates can be defined by a number N, where N is greater than 5. The plurality of substrates can comprise 5 or more individual substrates. In another embodiment, the plurality of substrates can comprise 40 or more individual substrates. Each substrate can have a dimension of about 65 cm to 165 cm. Each of the substrates is maintained in substantially a planar configuration free from warp or damage. For example, if the substrates were provided in an orientation other than vertical with respect to gravity, the gravitational force could cause the substrates to sag and warp. This occurs when the substrate material reaches a softening temperature, compromising the structural integrity of the substrate. Typically, glass substrates, particular soda lime glass substrates, begin to soften at 480° C. (often referred as to strain point). In an embodiment, the substrates are also separate from one another according to a predetermined spacing to ensure even heating and reactions with gaseous species that are to be introduced to the furnace.

After the substrates are positioned into the process chamber, gaseous species, including a hydrogen species, a selenium species, and/or a carrier gas, are introduced into the process chamber in step 406. In an embodiment, the gaseous species includes at least a selenide species, such as $H_2Se$, and nitrogen. In another embodiment, the gaseous species other types of chemically inert gas, such as helium, argon, etc. For example, the substrates are placed in the presence of a gas containing selenium, such as $H_2Se$.

The furnace is then heated up to a second temperature ranging from about 350° C. to 450° C. in step 408. The transfer of thermal energy for the purpose of heating the process chamber can be done by heating elements, heating coils, and the like. For example, step 408, among other things, at least starts the formation of a copper indium diselenide film by reactions between the gaseous species and the copper and indium composite (or layered) structure on each of the substrates. In a specific embodiment, separate layers of copper and indium material are diffused into each other to corm a single layer of copper indium alloy material. The second temperature is maintained for 10 to 60 minutes (period of time) at the heat treatment interval between 350 and 450° C., step 410. In another embodiment, the second temperature range can be from 390 to 410° C. For example, the period of time for maintaining the temperature at step 410 is provided to allow formation of the CIS film material. As the temperature increases, the pressure inside the furnace may increase as well. In a specific embodiment, a pressure release valve is used to keep the pressure within the furnace at approximately 650 ton.

In an embodiment, hydrogen delenide gas $H_2Se$ can be partially thermal cracked into the H atoms and Se vapor during the temperature ramping up from the first temperature to the second temperature and at the plateau of the second temperature. The Se vapor may be partially removed in one or more processes. For example, a cyropump can be installed for pumping out the Se vapor directly out of the chamber. In another example, a cooled end surface cap can serve as a cyropump to absorb or condense the Se vapor or clusters which are carried by a convection current from hot in-chamber processing region to the cooled end cap region, effectively pumping out the selenium species.

During the temperature hold (step 410), additional removal of the residual selenide species begins, in step 412. A vacuum has been formed in the process chamber through a vacuum pump, in step 414. In a specific embodiment, the residual selenide removal process may continue until the process chamber is in vacuum configuration as suggested in above paragraph. Once the vacuum is created in the process chamber (step 414), a hydrogen sulfide ($H_2S$) species is introduced, in step 416. The introduced $H_2S$, at the second temperature plateau, will induce an exchange reaction with the selenium species incorporated in the copper indium composite film. For example, a following reaction can occur, $CuInSe_2 + H_2S \rightarrow CuInSe_xS_{1-x} + H_2Se$, removing Se partially from the film on the substrate and producing $H_2Se$ back into the environment within the chamber. At the same time, Se particles or dust can be continuously transported by a convective current from the hot reaction chamber to cooler regions including the end cap region so that they can deposit on to the end cap surface, keeping the reaction chamber substantially free of elemental selenium. After the gas ambience in the furnace has been changed such that the selenide species is removed and the hydrogen sulfide species is introduced, a second temperature ramp up process is initiated, step 418. In a specific embodiment, the selenide species is introduced with nitrogen, which functions as a carrier gas. The temperature of the furnace is increased to a third temperature ranging from about 500 to 525° C. For example, the third temperature is calibrated for reaction between the hydrogen sulfide species and the substrates in furnace. In a preferred embodiment, the metal end cap 304 cools much faster than the quartz process chamber 302 due to a higher thermal conductivity of the metal end cap 304. The metal end cap 304 can stay "cool" (substantially under 200° C.) even when the chamber tube 302 is hot. A temperature gradient is created, which creates convection current within the inner process region 320. As a result, selenium and/or other residues are aggregated and deposited on the end cap. In a specific embodiment, the furnace 300 as described above have individually controllable heating units that are used to maintain temperature uniformity within the furnace. For example, these heaters can also be used to create a temperature difference that causes selenium and/or other residues to move to the end cap region.

At step 420, temperature is maintained at the third temperature for a period of time until the formation of the CIS layers is completed. The maintaining of time at this interval in the ambience of the furnace comprising the sulfur species is set up according to the purpose of extracting out one or more selenium species from the copper indium diselenide film. It is to be appreciate that a predetermined amount of selenium species are removed. In a specific embodiment, approximately 5% of the selenium is removed from the film and is replaced by about 5% of sulfur. According to an embodiment, a complete reaction between the selenium material with the CIS film is desired. After the removal of selenium species, a temperature ramp down process is initiated, in step 422. The furnace is cooled to the first temperature of about room temperature, and the remaining gaseous species are removed from the furnace, in step 424. For example, the gaseous species are removed by a vacuum pumping machine. The temperature sequence described above can be illustrated in the temperature profile in FIG. 5.

After the decomposition of the residual selenide species, a temperature ramp down process is initiated, in step 420. The furnace is cooled to the first temperature of about room temperature, and the remaining gaseous species are removed from the furnace. In a specific embodiment, the end cap material of the furnace is made of a specific material that cools faster than quartz tube of the processing chamber. As a result, an air flow is created toward the end cap (lower temperature) at the furnace, resulting in the residues to be deposited on the end cap. In an embodiment, the gaseous species are removed by a vacuum pumping machine. The temperature sequence described above can be illustrated in the temperature profile in FIG. 5.

After step 422, a final cleaning process is performed to remove various residues deposited on the end cap of the furnace. Depending on the condition, the residues may be removed by simply wiping down the end cap, scrapping, polishing, and/or other methods. It is to be appreciated that cleaning the end cap, which is easily removable from the furnace, is much more convenient than to cleaning the inside of a processing chamber.

Additional steps may be performed depending on the desired end product. For example, if a CIS or CIGS type of thin-film solar cell is desired, additional processes are provided to provide additional structures, such as a transparent layer of material such as ZnO overlaying the CIS layer.

It is also understood that the examples and embodiments described herein are for illustrative purposes only and that various modifications or changes in light thereof will be suggest to persons skilled in the art and are to be included within the spirit and purview of this application and scope of the appended claims.

Figure 5:
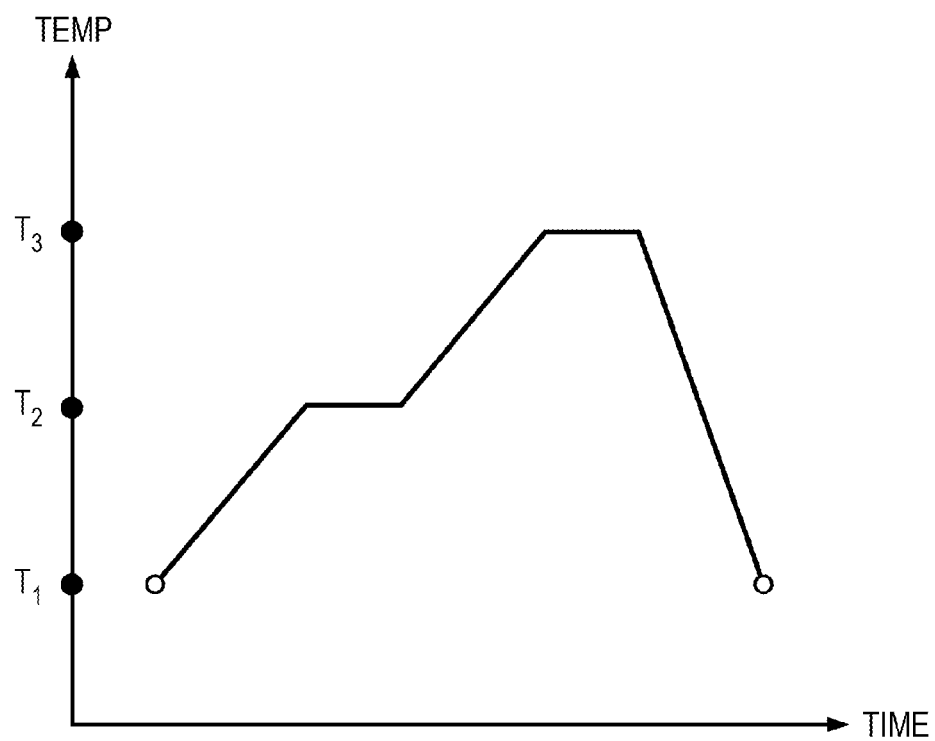

FIGS. 5 and 5A are simplified diagrams of a temperature profile of the furnace according to an embodiment of the present invention. These diagrams are merely an example, which should not limit the scope of the claims herein. The temperature profile further details the temperature ramping process in the above-described method outline (FIG. 4) and specification. An optimized temperature profile (FIGS. 5 and 5A) is provided to illustrate a heating process according to an embodiment of the present invention. The optimized profile regulates the process chamber in order to prevent thermal gradients and the warping of large substrates at high temperatures. If the temperature is ramped up too high too quickly, warping or damage may occur due to the softening of glass. In addition, the total amount of thermal energy is determined in consideration of total thermal budget available to the substrates and to maintain the uniformity and structure integrity of the glass substrate. For example, by periodically controlling the temperature of the heating process in steps, the substrate stays at a level of stabilization and relaxing in which the requisite structure integrity is maintained. As explained above, material such as glass tends to deform at a temperature of 480 degrees Celsius or higher, and thus caution is exercised to avoid prolong exposure of substrate at high temperatures. Referring to FIG. 5, while the ambience of a process chamber is maintained with a gaseous species including a selenide species and a carrier gas, a plurality of substrates is put into the furnace. In one embodiment, air within the process chamber is pumped out before the gaseous species are filled into the process chamber. In an exemplary embodiment, the carrier gas comprises nitrogen gas. For example, the gaseous species fills up the process chamber to a pressure of about 650 Torr.

The plurality of substrates is provided in a vertical orientation with respect to a direction of gravity, with the plurality of substrates being defined by a number N, where N is greater than 5. In an embodiment, the substrates include glass substrates, such as soda lime glass. The furnace is at a first temperature of less than 100° C. The furnace is then heated up to a second temperature ranging from about 350° C. to 450° C.

The second temperature is maintained for 10 to 60 minutes (period of time) at the heat treatment interval between 350 to 450° C. The size of glass substrate can be, but not limited to, 65 cm×165 cm. A challenge in processing such large substrate is the warping of the substrate at high temperatures. If the temperature is ramped up directly to T3, warping or damage may occur. As shown, the slope of ramping up from T2 to T3 is calibrated to reduce and/or eliminate the risk of damaging the substrate. In one embodiment, as shown in FIG. 5A, some of the selenide gas is removed when temperature ramps up from T2 to T3. By maintaining the temperature in the process chamber at T2 for a period of time, the substrate can relax and stabilize. The maintaining time at this interval is set up according to the purpose of at least initiating formation of the copper indium deselenide film from the copper and indium composite structure on each of the substrates.

The furnace is then cooled to a third temperature ranging from about 500° C. to room temperature. During the selenization process, residual selenide species may have accumulated in the inner process region 320 shown previously in FIG. 3. At high temperatures, the selenide species remains in vapor form within the inner process region 320. As the temperature decreases, the selenide species deposits upon cooler surfaces. In a preferred embodiment, the metal end cap 304 with no insulation cools much faster than the quartz process chamber 302 due to a higher thermal conductivity. A temperature gradient is created, which creates convection current within the inner process region 320. The convection current causes the elemental selenium to flow towards the end cap 304 and deposit on the cooler end cap region 322. Through this method, the inner process region 320 can be maintained substantially free from elemental selenium species by the decomposition of residual selenide species from the inner region of the process region.

After the ambience in the furnace has been changed such that any residual selenide species are decomposed and deposited at the end cap region 322, a additional steps can be introduced according to the process of forming the CIS layer on surface of the substrates. In another embodiment, additional temperature ramping and maintenance steps in order to prevent the substrates from warping or becoming damaged can be used in the forming of the CIS film.

After the formation of the CIS layer, a temperature ramp-down process is initiated, as the furnace is then cooled to the first temperature of about room temperature. According to an embodiment, the cooling process is specifically calibrated. As a result of this process, the copper, indium, and selenium interdiffuse and react to form a high quality copper indium diselenide film. In one embodiment, gaseous species such as nitrogen is used to during the cooling process.

Figure 6A:
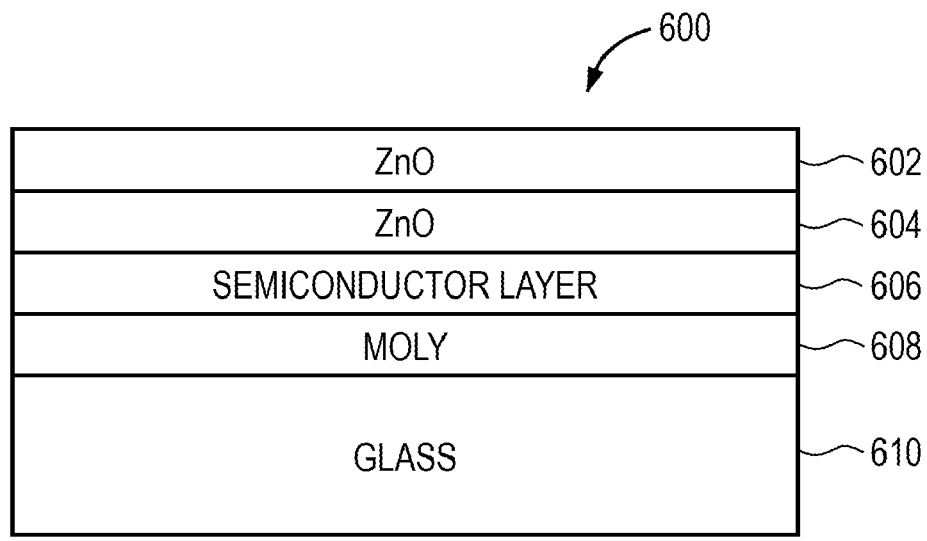
FIG. 6A is a simplified diagram of a thin film copper indium diselenide device according to an embodiment of the present invention.

FIG. 6A is a simplified diagram of a thin film copper indium diselenide device according to an embodiment of the present invention. This diagram is merely an example, which should not limit the scope of the claims herein. As shown, structure 600 is supported on a glass substrate 610. According to an embodiment, the glass substrate comprises soda lime glass, which is about 1 to 3 millimeters thick. A back contact including a metal layer 608 is deposited upon substrate 610. According to an embodiment, layer 608 comprises primarily a film of molybdenum which has been deposited by sputtering. The first active region of the structure 600 comprises a semiconductor layer 606. In an embodiment, the semiconductor layer includes p-type copper indium deselenide (CIS) material that is characterized by an overall thickness from 500 to 1500 µm. It is to be understood that other the semiconductor layer may include other types of material, such as CIGS. The second active portion of the structure 600 comprises layers 604 and 602 of n-type semiconductor material, such as CdS or ZnO. FIG. 6A shows the second active portion of the structure 600 comprising two CdS layers 602 and 604 with different levels of resistivity. Another embodiment is shown in FIG. 6B, in which the second active portion of the structure comprises both a CdS layer and a ZnO layer.

Figure 6B:
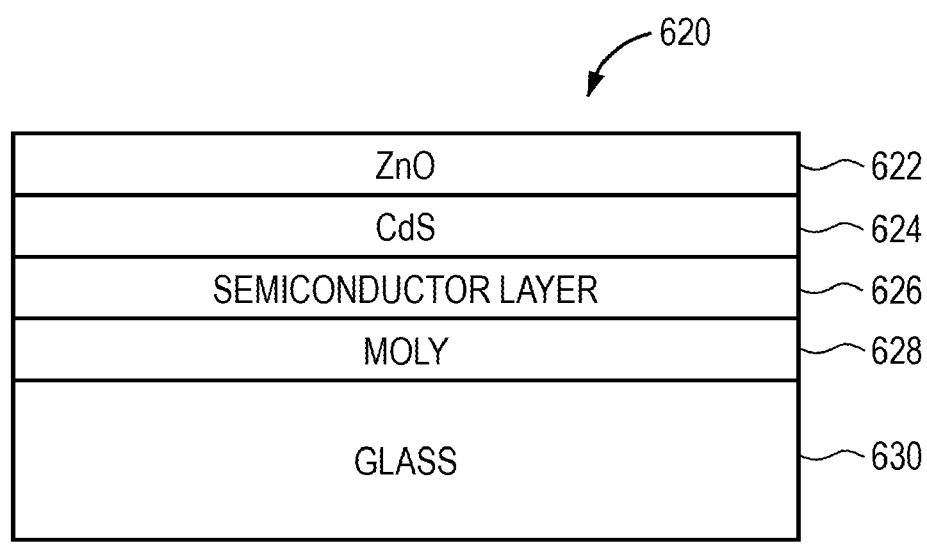
FIG. 6B is a simplified diagram of a thin film copper indium diselenide device according to another embodiment of the present invention.

FIG. 6B is a simplified diagram of a thin film copper indium diselenide device according to another embodiment of the present invention. This diagram is merely an example, which should not limit the scope of the claims herein. As shown, structure 620 is supported on a glass substrate 630. According to an embodiment, the glass substrate comprises soda lime glass, which is about 1 to 3 millimeters thick. A back contact including a metal layer 628 is deposited upon substrate 630. According to an embodiment, layer 628 comprises primarily a film of molybdenum which has been deposited by sputtering. The first active region of the structure 620 comprises a semiconductor layer 626. In an embodiment, the semiconductor layer includes p-type copper indium deselenide (CIS) material. It is to be understood that other the semiconductor layer may include other types of material, such as CIGS. The second active portion of the structure 620 comprises layers CdS 624 and ZnO 622 of n-type semiconductor material.

A photovoltaic cell, or solar cell, such as device 600 described above, is configured as a large-area p-n junction. When photons in sunlight hit the photovoltaic cell, the photons may be reflected, pass through the transparent electrode layer, or become absorbed. The semiconductor layer absorbs the energy causing electron-hole pairs to be created. A photon needs to have greater energy than that of the band gap in order to excite an electron from the valence band into the conduction band. This allows the electrons to flow through the material to produce a current. The complementary positive charges, or holes, flow in the direction opposite of the electrons in a photovoltaic cell. A solar panel having many photovoltaic cells can convert solar energy into direct current electricity.

Semiconductors based on the copper indium diselenide (CIS) configuration are especially attractive for thin film solar cell application because of their high optical absorption coefficients and versatile optical and electrical characteristics. These characteristics can in principle be manipulated and tuned for a specific need in a given device. Selenium allows for better uniformity across the layer and so the number of recombination sites in the film are reduced which benefits the quantum efficiency and thus the conversion efficiency.

The present invention provides methods for making CIS-based and/or CIGS-based solar cells on a large glass substrate for a solar panel. The device structure described in FIG. 6 can be patterned into individual solar cells on the glass substrate and interconnected to form the solar panel. A cost-effective method for making thin film solar cell panel.

It will be appreciated that all of the benefits of the present invention can be achieved regardless of the order of deposition of the copper and indium films. That is, the indium could be deposited first or the films could be deposited as a sandwich or stack of thinner layers.

It is also understood that the examples and embodiments described herein are for illustrative purposes only and that various modifications or changes in light thereof will be suggest to persons skilled in the art and are to be included within the spirit and purview of this application and scope of the appended claims.

FIG. 7 is a simplified diagram of a self cleaning furnace before the decomposition of the selenide species according to an embodiment of the present invention. This diagram is merely an example, which should not limit the scope of the claims herein. As shown, a furnace 700 includes a process chamber 702 and a chamber end cap 704. The inner surface and spatial region of the process chamber 702 is represented as an inner process region 706. In an embodiment, process chamber 702 comprises a quartz tube. An end cap region 708 represents the inner surface of the end cap 704 that is exposed to the inner process region 706. As described above, the end cap 704 and the process chamber 702 are characterized by different surface reactivity and/or adhesiveness to various types of gaseous species. For example, under a certain condition various types of materials may deposit on the end cap 704 but not on the inner surface of chamber 702. In a specific embodiment, the end cap region 702 is made of material that has lower specific heat than the process chamber 702. In an embodiment, end cap 704 consists at least a metal material. During the selenization process, residual selenide 710 may deposit in the inner process region 706. According to an embodiment, a temperature gradient can be formed by introducing mechanical baffle between the inner process region and the cap region so that a convective current can carry the residue away from the inner process region and prevent the residual selenide 710 from depositing in the inner process region 706.

It is also understood that the examples and embodiments described herein are for illustrative purposes only and that various modifications or changes in light thereof will be suggest to persons skilled in the art and are to be included within the spirit and purview of this application and scope of the appended claims.

FIG. 8A is a simplified diagram of a self cleaning furnace before the decomposition of the selenide species according to an embodiment of the present invention. This diagram is merely an example, which should not limit the scope of the claims herein. As shown, a furnace 800 includes a process chamber 802 and a chamber end cap 804. The inner surface and spatial region of the process chamber 802 is represented as an inner process region 806. In an embodiment, process chamber 802 can comprise a quartz tube. An end cap region 808 represents the inner surface of the end cap 804 that is exposed to the inner process region 806. In an embodiment, end cap 804 can be made of a metal material. During the selenization process, residual selenide 810 may have deposited in the inner process region 806. According to an embodiment, a temperature gradient can be formed by introducing mechanical baffle between the inner process region 806 and the cap region 808 so that a convective current can carry the residue particles away from the inner process region and substantially prevent the residual selenide 810 from depositing in the inner process region 806.

FIG. 8B is a simplified diagram of a self cleaning furnace during the decomposition of the selenide species and deposition of elemental selenium at the end cap according to an embodiment of the present invention. This diagram is merely an example, which should not limit the scope of the claims herein. As shown, a furnace 820 includes a process chamber 822 and a chamber end cap 824. The inner surface and spatial region of the process chamber 822 is represented as an inner process region 826. In an embodiment, process chamber 822 can comprise a quartz tube. An end cap region 828 represents the inner surface of the end cap 824 that is exposed to the inner process region 826. In an embodiment, end cap 824 can be made of a metal material. During the decomposition of the selenide species, the residual species 830 including elemental selenium becomes vaporized and flows, (carried by a convective current induced by thermal gradient), from the inner process region 826 towards the end cap region 824.

FIG. 8C is a simplified diagram of a self cleaning furnace after the decomposition of the selenide species and deposition of elemental selenium at the end cap according to an embodiment of the present invention. This diagram is merely an example, which should not limit the scope of the claims herein. As shown, a furnace 840 includes a process chamber 842 and a chamber end cap 844. The inner surface and spatial region of the process chamber 842 is represented as an inner process region 846. In an embodiment, process chamber 842 can comprise a quartz tube. An end cap region 848 represents the inner surface of the end cap 844 that is exposed to the inner process region 846. In an embodiment, end cap 844 can be made of a metal material. After the decomposition and deposition of the selenide species, the residual selenide 850 is contained in the end cap region 848. For example, the deposition or condensation of the residue selenide 810 is caused at least in part by a convection current due to temperature gradient between the end cap and the process chamber. The temperature gradient can be greatly enhanced by adding a baffle structure which serves as a controlled permeable barrier. After the forming of the CIS layer is complete and the substrates are removed from the process chamber 842, the residual selenide can be mechanically cleaned with a cloth, for example linseed cloth, or similar material. It is to be appreciated that the cleaning process is made convenient by aggregating selenide and/or other residues onto the end cap structure, on which the residues can be simply wipe off. In various conventional techniques, cleaning residues from the furnace typically requires cleaning the interior of the processing chamber.

FIGS. 8A, 8B, and 8C are simplified diagrams of the steps for the decomposition of the residual selenide and the path of the elemental selenium as it deposits at the end cap region of the process chamber.

It is also understood that the examples and embodiments described herein are for illustrative purposes only and that various modifications or changes in light thereof will be suggest to persons skilled in the art and are to be included within the spirit and purview of this application and scope of the appended claims.

Figure 9:
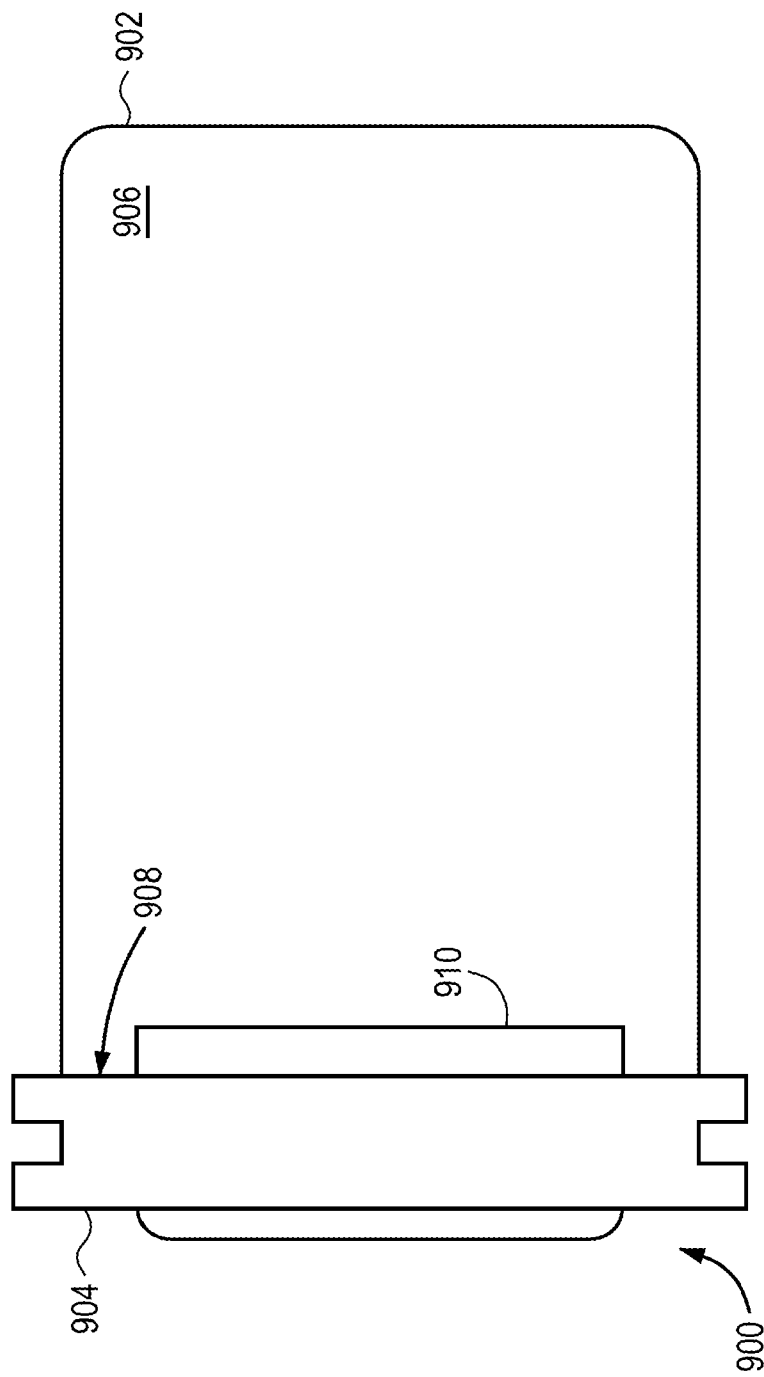
FIG. 9 is a simplified diagram of a self cleaning furnace after the decomposition of the selenide species and deposition of elemental selenium at the end cap according to an embodiment of the present invention.

FIG. 9 is a simplified diagram of a self cleaning furnace after the decomposition of the selenide species and deposition of elemental selenium at the end cap according to an embodiment of the present invention. This diagram is merely an example, which should not limit the scope of the claims herein. As shown, a furnace 900 includes a process chamber 902 and a chamber end cap 904. The inner surface and spatial region of the process chamber 902 is represented as an inner process region 906. In an embodiment, process chamber 902 can comprise a quartz tube. An end cap region 908 represents the inner surface of the end cap 904 that is exposed to the inner process region 906. In an embodiment, end cap 904 can be made of a metal material. After the decomposition and deposition of the selenide species, the residual selenide 910 is contained in the end cap region 908. After the forming of the CIS layer is complete and the substrates are removed from the process chamber 902, the residual selenide can be mechanically cleaned with a cloth, for example linseed cloth, or similar material.

It is also understood that the examples and embodiments described herein are for illustrative purposes only and that various modifications or changes in light thereof will be suggest to persons skilled in the art and are to be included within the spirit and purview of this application and scope of the appended claims. Although the above has been generally described in terms of a specific structure for CIS and/or CIGS thin film cells, other specific CIS and/or CIGS configurations can also be used, such as those noted in issued U.S. Pat. No. 4,611,091 and U.S. Pat. No. 4,612,411, which are hereby incorporated by reference herein, without departing from the invention described by the claims herein.

What is claimed is:

1. A method for fabricating a copper indium diselenide semiconductor film comprising:
    transferring a plurality of substrates into a furnace, the furnace comprising a processing region and at least one end cap region disengageably coupled to the processing region, wherein each of the plurality of substrates is provided in a vertical orientation with respect to a direction of gravity and includes a copper and indium composite structure;
    introducing a gaseous species including a hydrogen species and a selenide species and a carrier gas into the furnace;
    transferring thermal energy into the furnace to increase a temperature from a first temperature to a second temperature, the second temperature ranging from about 350 Degrees Celsius to about 450 Degrees Celsius;
    initiating formation of a copper indium diselenide film from the copper and indium composite structure;
    decomposing residual selenide species from an inner region of the processing region;
    depositing elemental selenium species within a vicinity of the at least one end cap region; and
    maintaining the inner region substantially free from elemental selenium species.

2. The method of claim 1 wherein during the deposition of the elemental selenium species, the vicinity of the at least one end cap region is characterized by a third temperature lower than a temperature of the processing region.

3. The method of claim 1 wherein the at least one end cap region is characterized by a specific heat that is lower that a specific heat of a furnace chamber.

4. The method of claim 1 wherein depositing elemental selenium species further comprises cooling the furnace by a predetermined amount.

5. The method of claim 1 further comprising removing deposited elemental selenium species from the at least one end cap region.

6. The method of claim 1 wherein a substrate, from among the plurality of substrates, comprises a gallium material.

7. The method of claim 1 wherein the second temperature ranges from about 390 Degrees Celsius to about 410 Degrees Celsius.

8. The method of claim 1 wherein the first temperature is about room temperature.

9. The method of claim 1 wherein the second temperature is maintained for about 10 to 60 minutes.

10. The method of claim 1 wherein the gaseous species comprises $H_2Se$.

11. The method of claim 1 wherein the carrier gas comprises nitrogen gas.

12. The method of claim 1 wherein the plurality of substrates include at least five substrates.

13. The method of claim 1 wherein the furnace is characterized by a temperature profile having a uniformity of about less than 10 degrees Celsius within the furnace.

14. The method of claim 1 wherein each of the substrates is free from warp or damage.

15. The method of claim 1 wherein the third temperature is less than the second temperature.

16. The method of claim 1 further comprising:
    introducing a hydrogen species and a sulfide species into the furnace; and
    increasing the temperature from the second temperature to a third temperature, wherein the third temperature ranges from about 500 to about 550 degrees Celsius.

17. The method of claim 1 further comprising removing a portion of the at least one end cap region and mechanically removing the elemental selenium species.

* * * * *